United States Patent
Liu

(10) Patent No.: US 7,560,738 B2
(45) Date of Patent: Jul. 14, 2009

(54) LIGHT-EMITTING DIODE ARRAY HAVING AN ADHESIVE LAYER

(75) Inventor: Wen-Huang Liu, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 440 days.

(21) Appl. No.: 10/906,894

(22) Filed: Mar. 11, 2005

(65) Prior Publication Data
US 2005/0224822 A1 Oct. 13, 2005

Related U.S. Application Data

(63) Continuation-in-part of application No. 10/604,245, filed on Jul. 4, 2003, now Pat. No. 6,987,287.

(30) Foreign Application Priority Data

Apr. 13, 2004 (TW) ............................. 93110342 A

(51) Int. Cl.
*H01L 29/88* (2006.01)
(52) U.S. Cl. .................. 257/88; 257/93; 257/96
(58) Field of Classification Search .......... 257/88, 257/93, 96
See application file for complete search history.

(56) References Cited

U.S. PATENT DOCUMENTS 6,547,249 B2 4/2003 Collins, III et al.
2002/0139987 A1 10/2002 Collins et al.
2003/0178627 A1* 9/2003 Marchl et al. ............... 257/80
2004/0007709 A1* 1/2004 Kondo ......................... 257/80
2004/0104393 A1 6/2004 Liu et al.
2004/0164311 A1* 8/2004 Uemura ....................... 257/99

FOREIGN PATENT DOCUMENTS

| DE | 3005956 A1 | 9/1981 |
|---|---|---|
| DE | 10125341 A1 | 12/2002 |
| DE | 10329884 A1 | 3/2004 |
| JP | 06-152070 | 5/1994 |
| JP | 09-223848 | 8/1997 |
| JP | 2003-068109 | 3/2003 |
| JP | 2004-014899 | 1/2004 |
| JP | 2004-056109 | 2/2004 |
| TW | 0522579 B | 3/2003 |
| TW | 0543211 B | 7/2003 |

* cited by examiner

*Primary Examiner*—Fernando L Toledo
(74) *Attorney, Agent, or Firm*—Quintero Law Office

(57) ABSTRACT

A light-emitting diode array includes a substrate, an adhesive layer formed on the substrate, and a plurality of electrically connected epitaxial light-emitting stack layer disposed on the adhesive layer. Each of the epitaxial light-emitting stack layer has a P-contact and an N-contact coplanar to the P-contact. The light-emitting diode array has improved heat ventilation characteristics.

47 Claims, 5 Drawing Sheets

LIGHT-EMITTING DIODE ARRAY HAVING AN ADHESIVE LAYER

This application is a continuation-in-part of U.S. application Ser. No. 10/604,245, filed Jul. 4, 2003 now U.S. Pat. No. 6,987,287.

BACKGROUND OF INVENTION

1. Field of the Invention

The present invention relates to a light-emitting diode, and more particularly, to a light-emitting diode array having an adhesive layer.

2. Description of the Prior Art

Light-emitting diodes (LEDs) are employed in a wide variety of applications including optical display devices, traffic lights, data storage equipment, communications devices, illumination apparatuses, and medical treatment equipment. One of the most important goals of engineers who design LEDs is to increase the brightness of the light emitted.

U.S. Pat. No. 6,547,249 discloses monolithic serial/parallel LED arrays formed on highly resistive substrates. According to the patent, a Group III-V nitride light-emitting stack layer is formed on an insulating substrate. A portion of the stack layer is etched away to form a trench, and in result to form the LED array, which includes a plurality of light-emitting diodes divided by the trench. Since the insulating substrate is not conductive, both P-contacts and N-contacts for the LED array have to be formed on the same side of the LED array. In use, two LED arrays can be connected either in series or in parallel. However, the LED array disclosed by the patent cannot be applied to a quaternary Al—In—Ga—P light-emitting diode, which comprises a conductive substrate rather than an insulating substrate, P-contacts formed on one side of the conductive substrate, and N-contacts having to be formed on the other side. Therefore, two quaternary Al—In—Ga—P light-emitting diode arrays can be connected neither in series nor in parallel. Moreover, as the size of the LED array become larger, the operating voltage of the LED array becomes higher accordingly, and heat dissipation becomes an important concern for the LED array.

SUMMARY OF INVENTION

It is therefore a primary objective of the claimed invention to provide an LED array having an adhesive layer to overcome the drawbacks of the prior art.

According to the claimed invention, the light-emitting diode array includes a substrate, a reflective layer formed on the substrate, an insulating transparent adhesive layer formed on the reflective layer, a transparent conductive layer formed on the insulating transparent adhesive layer, a first conductive semiconductor stack layer formed on the transparent conductive layer, a light-emitting layer formed on the first conductive semiconductor stack layer, and a second conductive semiconductor stack layer formed on the light-emitting layer.

A trench is formed by etching away a portion of the second conductive semiconductor stack layer, the light-emitting layer, the first conductive semiconductor stack layer, the transparent conductive layer, and the insulating transparent adhesive layer sequentially, and therefore the LED array is divided into a first LED and a second LED, both of which have the substrate in common. Moreover, a transparent conductive layer exposed surface region is formed by etching both of the first LED and the second LED deeply into the transparent conductive layer. The LED array further includes an insulating layer formed surrounding the first LED and the second LED for electrically isolating the first LED from the second LED. First contacts formed on the second conductive semiconductor stack layer of the first LED and the second conductive semiconductor stack layer of the second LED respectively. Second contacts formed on the transparent conductive layer exposed surface region of the first LED and the transparent conductive layer exposed surface region of the second LED respectively, and a conductive line for electrically connecting a second contact of the first LED to a first contact of the second LED.

The substrate comprises at least one material selected from a material group consisting of GaP, GaAs, Si, SiC, $Al_2O_3$, glass, quartz, GaAsP, AlN, metal, and AlGaAs. The insulating transparent adhesive layer comprises at least one material selected from a material group consisting of polyimide (PI), benzocyclobutene (BCB), and perfluorocyclobutene (PFCB). The reflective layer comprises at least one material selected from a material group consisting of In, Sn, Al, Au, Pt, Zn, Ge, Ag, Ti, Pb, Pd, Cu, AuBe, AuGe, Ni, PbSn, AuZn, and indium-tin oxide (ITO). The light-emitting layer comprises at least one material selected from a material group consisting of AlGaInP, GaN, InGaN, AlInGaN, and ZnSe. The transparent conductive layer comprises at least one material selected from a material group consisting of indium-tin oxide (ITO), cadmium-tin oxide (CTO), antimony-tin oxide (ATO), zinc oxide, and zinc-tin oxide. The insulating layer comprises at least one material selected from a material group consisting of $SiO_2$ and $SiN_x$. The first semiconductor stack layer comprises at least one material selected from a material group consisting of AlInP, AlN, GaN, InGaN, AlGaN, and AlInGaN. The second semiconductor stack layer comprises at least one material selected from a material group consisting of AlInP, AlN, GaN, InGaN, AlGaN, and AlInGaN.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
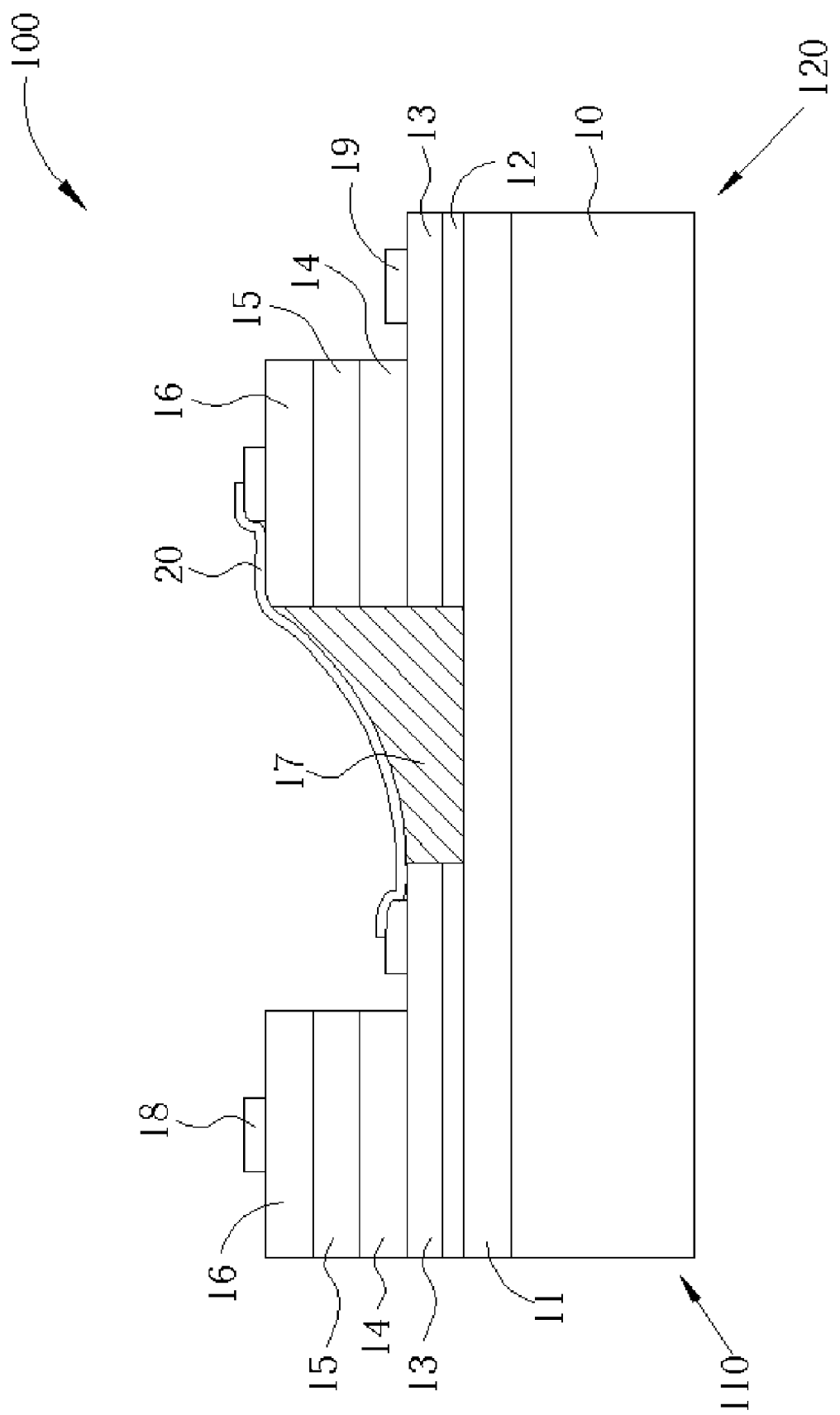
FIG. 1 is a cross sectional schematic diagram of a light-emitting diode array having an adhesive layer of the preferred embodiment according to the present invention.

Please refer to FIG. 1, which is a cross sectional schematic diagram of a light-emitting diode array 100 of the preferred embodiment according to the present invention. The LED array 100 comprises a substrate 10, a reflective layer 11 formed on the substrate 10, an insulating transparent adhesive layer 12 formed on the reflective layer 11, a transparent conductive layer 13 formed on the insulating transparent adhesive layer 12, a first conductive semiconductor stack layer 14 formed on the transparent conductive layer 13, a light-emitting layer 15 formed on the first conductive semiconductor stack layer 14, a second conductive semiconductor stack layer 16 formed on the light-emitting layer 15.

A trench is formed by etching away a portion of the second conductive semiconductor stack layer 16, the light-emitting layer 15, the first conductive semiconductor stack layer 14, the transparent conductive layer 13, and the insulating transparent adhesive layer 12 sequentially, and therefore the LED array 100 is divided into a first LED 110 and a second LED 120, both of which have the substrate 10 in common. Moreover, a transparent conductive layer exposed surface region is formed by etching both of the first LED 110 and the second LED 120 moderately to the transparent conductive layer 13. The LED array 100 further comprises an insulating layer 17 formed surrounding the first LED 110 and the second LED 120 for electrically isolating the first LED 110 from the second LED 120. First contacts 18 formed on the second conductive semiconductor stack layer 16 of the first LED 110 and the second conductive semiconductor stack layer 16 of the second LED 120 respectively. Second contacts 19 formed on the transparent conductive layer exposed surface region of the first LED 110 and the transparent conductive layer exposed surface region of the second LED 120 respectively, and a conductive line 20 for electrically connecting a second contact of the first LED 110 to a first contact of the second LED 120.

Figure 2:
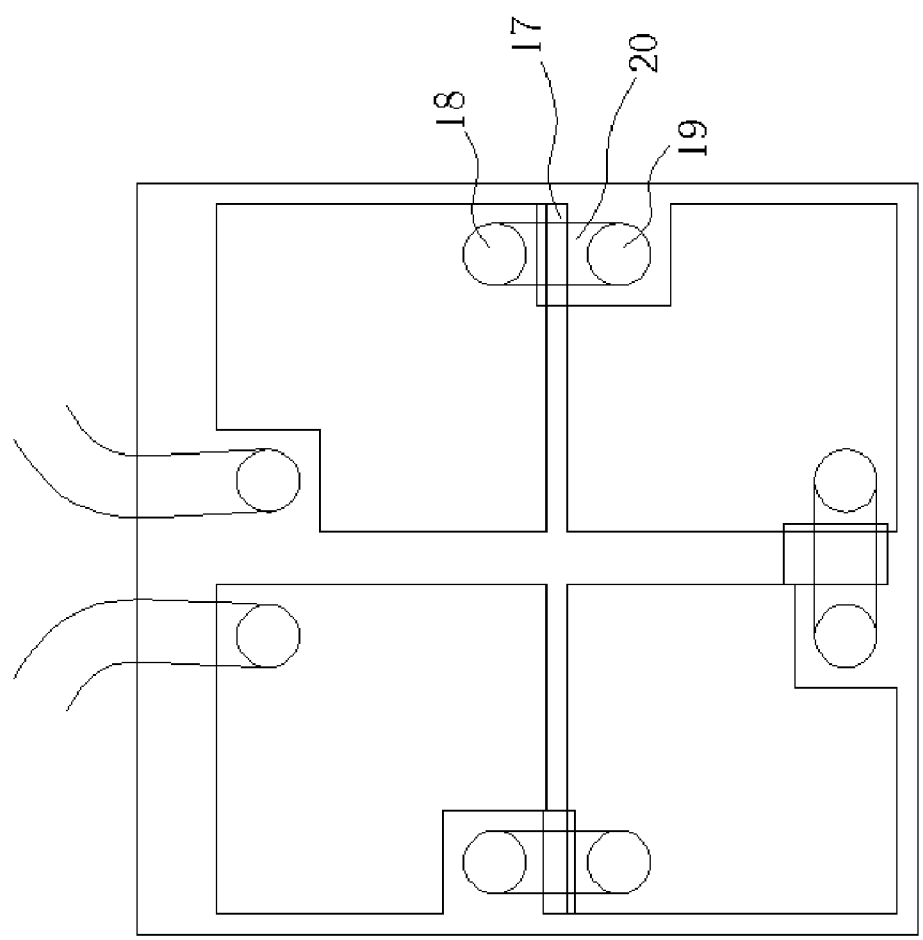
FIG. 2 is a top view of a schematic diagram of a plurality of serially connected LED arrays shown in FIG. 1 according to the present invention.
Figure 3:
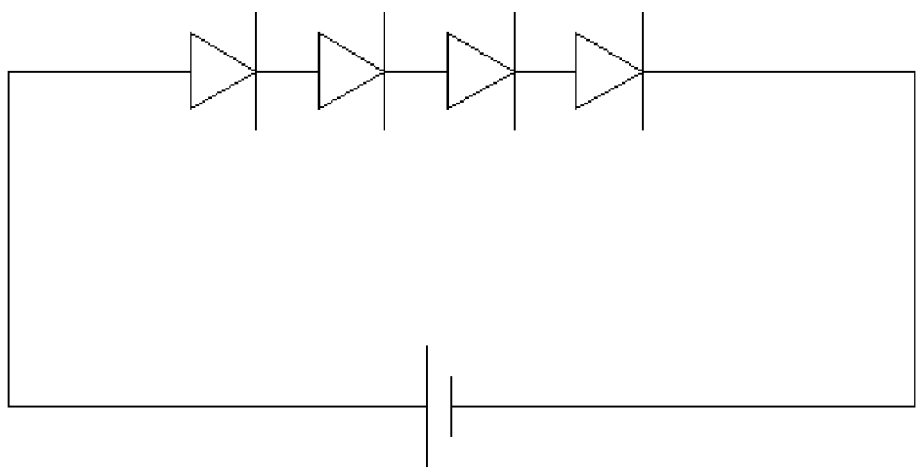
FIG. 3 is an equivalent circuit diagram of the LED arrays shown in FIG. 2 according to the present invention.
Figure 4:
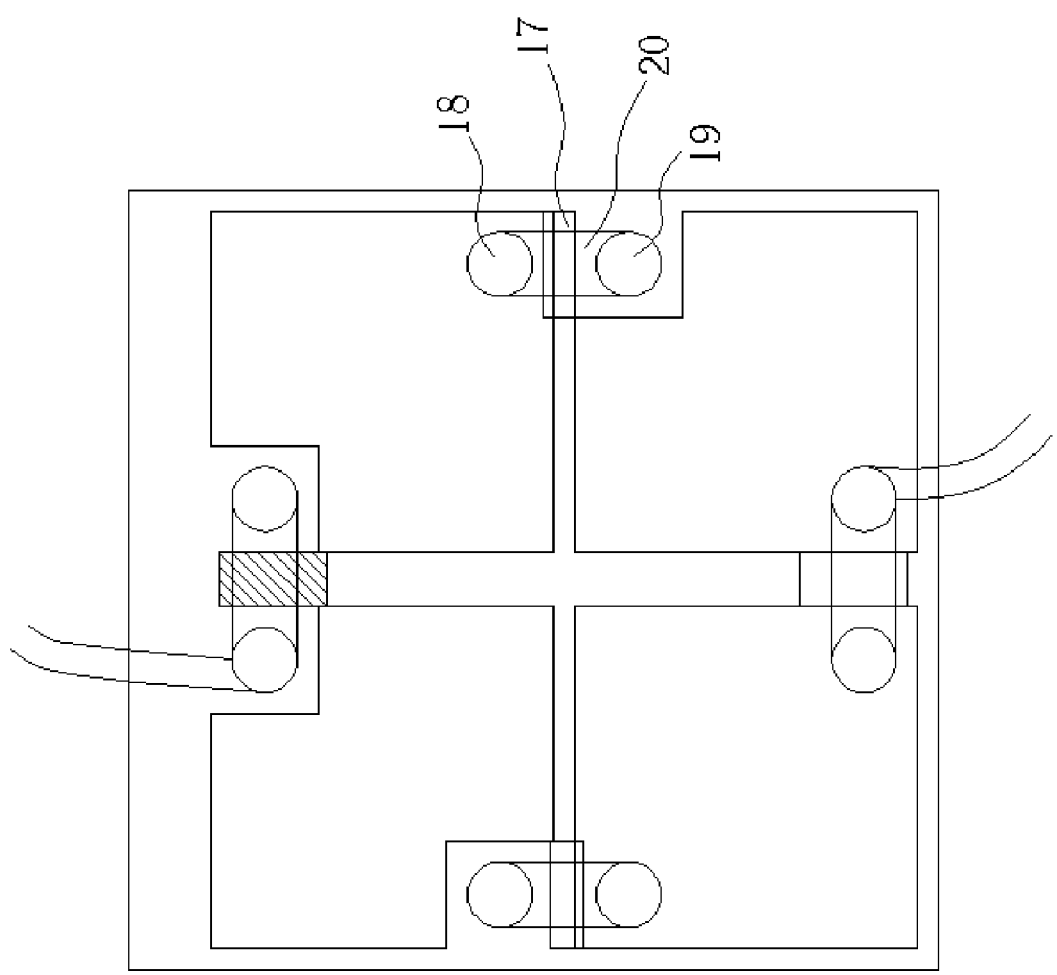
FIG. 4 is a top view of a schematic diagram of a plurality of serially and parallelly connected LED arrays shown in FIG. 1 according to the present invention.
Figure 5:
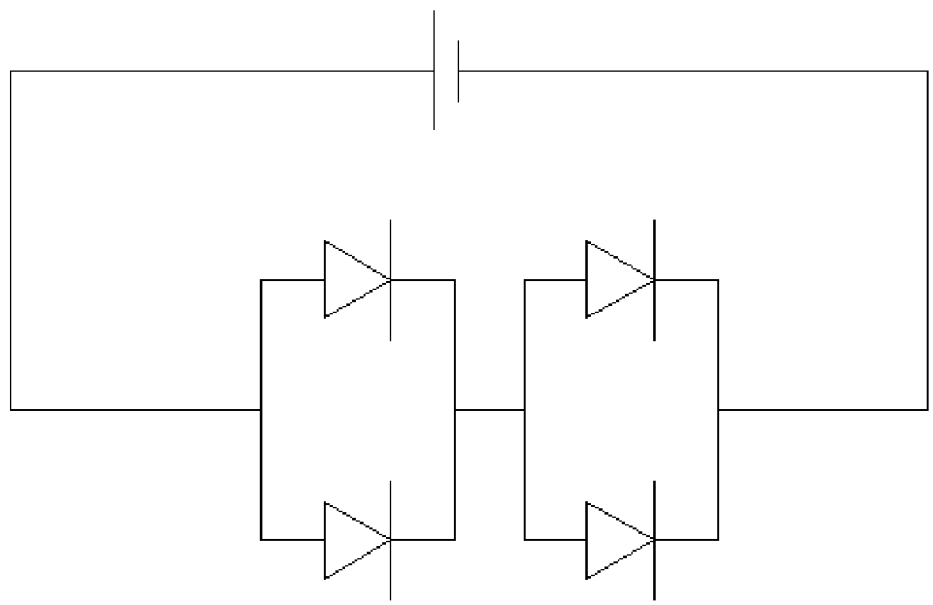
FIG. 5 is an equivalent circuit diagram of the LED arrays shown in FIG. 4 according to the present invention.

FIG. 2 is a top view of a schematic diagram of a plurality of LED arrays 100 connected in series according to the present invention. FIG. 3 is an equivalent circuit diagram of the LED arrays shown in FIG. 2. FIG. 4 is a top view of a schematic diagram of a plurality of LED arrays 100 connected in series and in parallel according to the present invention. FIG. 5 is an equivalent circuit diagram of the LED arrays shown in FIG. 4.

The reflective layer 11 can be also formed between the transparent conductive layer 13 and the adhesive layer 12. The reflective layer 11 is installed to increase the luminance of the LED array 100 by reflecting light projected onto the substrate 10. However, the LED array 100 still can operate without the reflective layer 11.

The insulating transparent adhesive layer 12 is installed to electrically isolate the first LED 110 and the second LED 120 from the substrate 10. The insulating transparent adhesive layer 12 can be replaced by a conductive adhesive layer made of metal or solder. However, an insulating layer providing electrical isolation has to be installed additionally between the substrate 10 and the conductive adhesive layer 12 or between the conductive adhesive layer 12 and the transparent conductive layer 13 to electrically isolate the first LED 110 and the second LED 120 from the substrate 10.

The trench together with the insulating layer 17 electrically isolates the first LED 110 from the second LED 120. However, the LED array 100 can further comprise an ion-implanted region formed between the first LED 110 and the second LED 120 for electrically isolating the first LED 110 from the second LED 120.

The substrate 10 comprises at least one material selected from a material group consisting of GaP, GaAs, Si, SiC, $Al_2O_3$, glass, quartz, GaAsP, AlN, metal, and AlGaAs. The insulating transparent adhesive layer 12 comprises at least one material selected from a material group consisting of polyimide (PI), benzocyclobutene (BCB), and perfluorocyclobutene (PFCB). The reflective layer 11 comprises at least one material selected from a material group consisting of In, Sn, Al, Au, Pt, Zn, Ge, Ag, Ti, Pb, Pd, Cu, AuBe, AuGe, Ni, PbSn, AuZn, and indium-tin oxide (ITO). The light-emitting layer 15 comprises at least one material selected from a material group consisting of AlGaInP, GaN, InGaN, AlInGaN, and ZnSe. The transparent conductive layer 13 comprises at least one material selected from a material group consisting of indium-tin oxide (ITO), cadmium-tin oxide (CTO), antimony-tin oxide (ATO), zinc oxide, and zinc-tin oxide. The insulating layer 17 comprises at least one material selected from a material group consisting of $SiO_2$ and $SiN_x$. The first conductive semiconductor stack layer 14 comprises at least one material selected from a material group consisting of AlInP, AlN, GaN, InGaN, AlGaN, and AlInGaN. The second conductive semiconductor stack layer 16 comprises at least one material selected from a material group consisting of AlInP, AlN, GaN, InGaN, AlGaN, and AlInGaN.

Since the insulating transparent adhesive layer 12 has a high resistance and is capable of electrically isolating the substrate 10 from the first LED 110 and the second LED 120 when being installed between them, the first LED 110 and the second LED 120 can comprise not only a Group III-V nitride material, but also a quaternary material. Moreover, since the substrate 10 is electrically isolated from the LEDs 110 and 120, the substrate 10 can be an insulating substrate, a substrate having a high resistance, a conductive substrate, or a substrate having a high thermal conduvtivity, which has a capability to improve the heat-dissipation efficiency of the LED array 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode array comprising: a substrate; an adhesive layer formed on the substrate; and a plurality of electrically connected epitaxial light-emitting stack layers disposed on the adhesive layer, each of the epitaxial light-emitting stack layers comprising a P-contact and an N-contact, wherein the P-contact and the N-contact are disposed on the same side of the epitaxial light-emitting stack layer.

2. The light-emitting diode array of claim 1, wherein each of the epitaxial light-emitting stack layers further comprises: a first conductive semiconductor stack layer;
   a light-emitting layer formed on the first conductive semiconductor stack layer; and a second conductive semiconductor stack layer formed on the light-emitting layer.

3. The light-emitting diode array of claim 1 further comprising a plurality of insulating regions formed between any two adjacent epitaxial light-emitting stack layers for electrically isolating one of these two adjacent epitaxial light-emitting stack layers from the other.

4. The light-emitting diode array of claim 1 further comprising a reflective layer formed between the substrate and the adhesive layer.

5. The light-emitting diode array of claim 1 further comprising a reflective layer formed between the adhesive layer and the epitaxial light-emitting stack layer.

6. The light-emitting diode array of claim 4, wherein the reflective layer comprises at least one material selected from a material group consisting of Sn, Al, Au, Pt, Zn, Ge, Ag, Ti, Pb, Pd, Cu, AuBe, AuGe, Ni, PbSn, AuZn, and indium-tin oxide (ITO).

7. The light-emitting diode array of claim 5, wherein the reflective layer comprises at least one material selected from a material group consisting of Sn, Al, Au, Pt, Zn, Ge, Ag, Ti, Pb, Pd, Cu, AuBe, AuGe, Ni, PbSn, AuZn, and indium-tin oxide (ITO).

8. The light-emitting diode array of claim 1, wherein the substrate comprises at least one material selected from a material group consisting of GaP, GaAs, Si, SiC, Al₂O₃, glass, quartz, GaAsP, AlN, metal, and AlGaAs.

9. The light-emitting diode array of claim 1, wherein the adhesive layer comprises at least one material selected from a material group consisting of polyimide (PI), benzocyclobutene (BCB), and perfluorocyclobutene (PFCB).

10. The light-emitting diode array of claim 1, wherein the adhesive layer is a metal adhesive layer made of metal.

11. The light-emitting diode array of claim 10 further comprising an insulating layer formed between the metal adhesive layer and the epitaxial light-emitting stack layer.

12. The light-emitting diode array of claim 10 further comprising an insulating layer formed between the metal adhesive layer and the substrate.

13. A light-emitting diode array comprising: a substrate; an adhesive layer formed on the substrate, the adhesive layer comprising a top surface and a plurality of adhesive regions disposed on the top surface; a first light-emitting stack layer formed on a first adhesive region of the plurality of adhesive regions, the first light-emitting stack layer comprising a top surface, a first first-conductivity contact region formed on the top surface, and a first second-conductivity contact region formed on the top surface; a first first-conductivity conductive contact formed on the ffirst first-conductivity contact region; a first second-conductivity conductive contact formed on the first second-conductivity contact region; a second light-emitting stack layer formed on a second adhesive region of the plurality of adhesive regions, the second light-emitting stack layer comprising a top surface, a second first conductive contact region formed on the top surface, and a second second-conductivity contact region formed on the top surface; a second first-conductivity conductive contact formed on the second first-conductivity contact region; a second second-conductivity conductive contact formed on the second second-conductivity contact region; and a first conductive line for electrically connecting either of the conductive contacts of the first light-emitting stack layer to either of the conductive contacts of the second light-emitting stack layer.

14. The light-emitting diode array of claim 13, wherein the first-conductivity contact region is n-type, and the second-conductivity contact region is p-type.

15. The light-emitting diode array of claim 13, wherein the first light-emitting stack layer further comprises: a first first-conductivity semiconductor stack layer; a first light-emitting layer formed on the first first-conductivity semiconductor stack layer; and a first second-conductivity semiconductor stack layer formed on the first light-emitting layer.

16. The light-emitting diode array of claim 13, wherein the second light-emitting stack layer further comprises: a second first-conductivity semiconductor stack layer; a second light-emitting layer formed on the second first-conductivity semiconductor stack layer; and a second second-conductivity semiconductor stack layer formed on the second light-emitting layer.

17. The light-emitting diode array of claim 13 further comprising a insulating region formed between the first light-emitting stack layer and the second light-emitting stack layer for electrically isolating one of these two light-emitting stack layer from the other.

18. The light-emitting diode array of claim 13 further comprising a reflective layer formed between the substrate and the adhesive layer.

19. The light-emitting diode array of claim 13 further comprising a reflective layer formed between the adhesive layer and the first light-emitting stack layer.

20. The light-emitting diode array of claim 13 further comprising a reflective layer formed between the adhesive layer and the second light-emitting stack layer.

21. The light-emitting diode array of claim 17, wherein the reflective layer comprises at least one material selected from a material group consisting of Sn, Al, Au, Pt, Zn, Ge, Ag, Ti, Pb, Pd, Cu, AuBe, AuGe, Ni, PbSn, AuZn, and indium-tin oxide (ITO).

22. The light-emitting diode array of claim 18, wherein the reflective layer comprises at least one material selected from a material group consisting of Sn, Al, Au, Pt, Zn, Ge, Ag, Ti, Pb, Pd, Cu, AuBe, AuGe, Ni, PbSn, AuZn, and indium-tin oxide (ITO).

23. The light-emitting diode array of claim 19, wherein the reflective layer comprises at least one material selected from a material group consisting of Sn, Al, Au, Pt, Zn, Ge, Ag, Ti, Pb, Pd, Cu, AuBe, AuGe, Ni, PbSn, AuZn, and indium-tin oxide (ITO).

24. The light-emitting diode array of claim 13, wherein the substrate comprises at least one material selected from a material group consisting of GaP, GaAs, Si, SiC, Al₂O₃, glass, quartz, GaAsP, AlN, metal, and AlGaAs.

25. The light-emitting diode array of claim 13, wherein the adhesive layer comprises at least one material selected from a material group consisting of polyimide (PI), benzocyclobutene (BCB), and perfluorocyclobutene (PFCB).

26. The light-emitting diode array of claim 13, wherein the adhesive layer is a metal adhesive layer made of metal.

27. The light-emitting diode array of claim 26 further comprising an insulating layer formed between the metal adhesive layer and the first light-emitting stack layer and between the metal adhesive layer and the second light-emitting stack layer.

28. The light-emitting diode array of claim 26 further comprising an insulating layer formed between the metal adhesive layer and the substrate.

29. The light-emitting diode array of claim 15 further comprising a transparent conductive layer formed between the adhesive layer and the first first-conductivity semiconductor stack layer.

30. The light-emitting diode array of claim 16 further comprising a transparent conductive layer formed between the adhesive layer and the second first-conductivity semiconductor stack layer.

31. The light-emitting diode array of claim 17, wherein the insulating region is in the form of a trench.

32. The light-emitting diode array of claim 17, wherein the insulating region is composed of an ion-implanted region.

33. The light-emitting diode array of claim 13 further comprising: a third light-emitting stack layer formed on a third adhesive region of the plurality of adhesive regions, the third light-emitting stack layer comprising a top surface, a third first-conductivity contact region formed on the top surface, and a third second-conductivity contact region formed on the top surface; a third first-conductivity conductive contact formed on the third first-conductivity contact region; a third second-conductivity conductive contact formed on the third second-conductivity contact region;

a fourth light-emitting stack layer formed on a fourth adhesive region of the plurality of adhesive regions, the fourth light-emitting stack layer comprising a top surface, a fourth first-conductivity contact region formed on the top surface, and a fourth second-conductivity contact region formed on the top surface; a fourth first-conductivity conductive contact formed on the fourth first-conductivity contact region; a fourth second-conductivity conductive contact formed on the fourth second-conductivity contact region; and a second conductive line for electrically connecting the first first-conductivity conductive contact to the third second-conductivity conductive contact; a third conductive line for electrically connecting the second first-conductivity conductive contact to the fourth second-conductivity conductive contact; and a fourth conductive line for electrically connecting the third first-conductivity conductive contact to the fourth first-conductivity conductive contact; wherein the first conductive line connects the first second-conductivity conductive contact to the second second-conductivity conductive contact.

34. The light-emitting diode array of claim 33 further comprising an insulating region formed between the third light-emitting stack layer and the second light-emitting stack layer for electrically isolating the third light-emitting stack layer from the second light-emitting stack layer.

35. The light-emitting diode array of claim 33 further comprising an insulating region formed between the third light-emitting stack layer and the fourth light-emitting stack layer for electrically isolating the third light-emitting stack layer from the fourth light-emitting stack layer.

36. The light-emitting diode array of claim 34, wherein the insulating region is in the form of a trench.

37. The light-emitting diode array of claim 34, wherein the insulating region is composed of an ion-implanted region.

38. The light-emitting diode array of claim 35, wherein the insulating region is in the form of a trench.

39. The light-emitting diode array of claim 35, wherein the insulating region is composed of an ion-implanted region.

40. The light-emitting diode array of claim 33, wherein the first-conductivity contact region is n-type electro-polarization, and the second-conductivity contact region is p-type electro-polarization.

41. The light-emitting diode array of claim 33, wherein the third light-emitting stack layer further comprises: a third first-conductivity semiconductor stack layer; a third light-emitting layer formed on the third first-conductivity semiconductor stack layer; and a third second-conductivity semiconductor stack layer formed on the third light-emitting layer.

42. The light-emitting diode array of claim 33, wherein the fourth light-emitting stack layer further comprises: a fourth first-conductivity semiconductor stack layer; a fourth light-emitting layer formed on the fourth first-conductivity semiconductor stack layer; and a fourth second-conductivity semiconductor stack layer formed on the fourth light-emitting layer.

43. The light-emitting diode array of claim 33 further comprising a reflective layer formed between the substrate and the adhesive layer.

44. The light-emitting diode array of claim 33 further comprising a reflective layer formed between the third light-emitting stack layer and the adhesive layer.

45. The light-emitting diode array of claim 33 further comprising a reflective layer formed between the fourth light-emitting stack layer and the adhesive layer.

46. The light-emitting diode array of claim 41 further comprising a transparent conductive layer formed between the adhesive layer and the third second-conductivity semiconductor stack layer.

47. The light-emitting diode array of claim 42 further comprising a transparent conductive layer formed between the adhesive layer and the fourth second-conductivity semiconductor stack layer.

* * * * *